(12) United States Patent
Hasenoehrl et al.

(10) Patent No.: US 9,373,754 B2
(45) Date of Patent: Jun. 21, 2016

(54) ENHANCED LIGHT OUTPUT FROM A LED CONTAINING LAMINATE

(71) Applicant: NthDegree Technologies Worldwide Inc., Tempe, AZ (US)

(72) Inventors: Erik John Hasenoehrl, Loveland, OH (US); Kenneth Stephen McGuire, Cincinnati, OH (US)

(73) Assignee: NthDegree Technologies Worldwide Inc, Tempe, AZ (US)

( * ) Notice: Subject to any disclaimer, the term of this patent is extended or adjusted under 35 U.S.C. 154(b) by 0 days.

(21) Appl. No.: 14/446,382

(22) Filed: Jul. 30, 2014

(65) Prior Publication Data
US 2014/0332828 A1 Nov. 13, 2014

Related U.S. Application Data

(63) Continuation of application No. PCT/US2013/024320, filed on Feb. 1, 2013.

(60) Provisional application No. 61/593,917, filed on Feb. 2, 2012.

(51) Int. Cl.
| | |
|---|---|
| H01L 33/46 | (2010.01) |
| H01L 33/48 | (2010.01) |
| H01L 33/44 | (2010.01) |
| H01L 27/15 | (2006.01) |
| H01L 33/52 | (2010.01) |
| H01L 33/60 | (2010.01) |
| H01L 33/62 | (2010.01) |
| H01L 33/50 | (2010.01) |
| F21K 99/00 | (2010.01) |

(Continued)

(52) U.S. Cl.
CPC .............. *H01L 33/46* (2013.01); *F21K 9/135* (2013.01); *H01L 25/0753* (2013.01); *H01L 27/153* (2013.01); *H01L 33/44* (2013.01); *H01L 33/48* (2013.01); *F21Y 2101/02* (2013.01); *H01L 33/507* (2013.01); *H01L 33/52* (2013.01); *H01L 33/60* (2013.01); *H01L 33/62* (2013.01); *H01L 2924/0002* (2013.01); *H01L 2933/0025* (2013.01); *H01L 2933/0033* (2013.01)

(58) Field of Classification Search
None
See application file for complete search history.

(56) References Cited

U.S. PATENT DOCUMENTS

| | | | |
|---|---|---|---|
| 5,469,020 A | 11/1995 | Herrick | |
| 6,504,180 B1 * | 1/2003 | Heremans | G02B 6/4249 257/88 |
| 6,821,804 B2 | 11/2004 | Thibeault et al. | |

(Continued)

FOREIGN PATENT DOCUMENTS

| | | |
|---|---|---|
| DE | 103 15 417 A1 | 11/2004 |
| WO | WO 2011/082497 A1 | 7/2011 |

OTHER PUBLICATIONS

International Search Report; International Application No. PCT/US2013/024320; date of mailing May 6, 2013; 11 pages.

(Continued)

*Primary Examiner* — William Coleman
*Assistant Examiner* — Kien Ly
(74) *Attorney, Agent, or Firm* — Nancy R. Gamburd; Gamburd Law Group LLC

(57) ABSTRACT

A laminate capable of emitting light comprises a reflective layer. The reflective layer increases the amount of light output from the laminate. A lighting apparatus containing the improved laminate is also provided.

18 Claims, 2 Drawing Sheets

(51) Int. Cl.
*H01L 25/075* (2006.01)
*F21Y 101/02* (2006.01)

(56) References Cited

U.S. PATENT DOCUMENTS

| | | | |
|---|---|---|---|
| 7,259,030 B2 | 8/2007 | Daniels et al. | |
| 7,799,699 B2 | 9/2010 | Nuzzo et al. | |
| 8,044,415 B2 | 10/2011 | Messere et al. | |
| 8,314,566 B2* | 11/2012 | Steele | F21K 9/135 315/185 R |
| 8,343,571 B2 | 1/2013 | Werners et al. | |
| 2005/0214963 A1* | 9/2005 | Daniels | H01L 24/29 438/29 |
| 2007/0290217 A1 | 12/2007 | Daniels | |
| 2008/0211416 A1* | 9/2008 | Negley | H01L 27/15 315/193 |
| 2008/0297071 A1 | 12/2008 | Ray et al. | |
| 2011/0058372 A1* | 3/2011 | Lerman | H05K 1/0204 362/235 |
| 2011/0163683 A1 | 7/2011 | Steele et al. | |
| 2011/0193105 A1* | 8/2011 | Lerman | H01L 25/0753 257/88 |
| 2011/0204020 A1 | 8/2011 | Ray et al. | |
| 2011/0278614 A1* | 11/2011 | Maier-Richter et al. | 257/98 |

OTHER PUBLICATIONS

International Search Report; International Application No. PCT/US2013/024312; date of mailing May 27, 2013; 12 pages.
U.S. Appl. No. 14/446,373, filed Jul. 30, 2014, Hasenoehrl, et al.

* cited by examiner

ENHANCED LIGHT OUTPUT FROM A LED CONTAINING LAMINATE

FIELD OF THE INVENTION

The present invention is directed to LED lighting.

BACKGROUND OF THE INVENTION

The use of a light emitting diode (LED) is an effective means of producing light. Relatively small LEDs (i.e., having a diameter less than 100 microns) have the benefit of more efficient cooling than larger LEDs. Part of the efficiency is attributed to the LED s being capable of being spaced further apart and yet still yield effective light output on a per unit area basis.

The use of Stokes shifting phosphors is a known means of taking a relatively narrow wavelength of emitted light from LEDs (e.g. 470 nm) and converting a portion of that light into a broader range of longer wavelengths, thus creating "white light" that is desired in many lighting applications. One disadvantage of using down shifting phosphors is the accompanying energy (and thus efficiency) loss in the process. Much of the energy lost in larger LEDs is a result of light being re-emitted from the phosphor back into the LED from which the original light originated. This re-captured light is eventually lost and converted into heat, and in a system where the phosphor is coated directly onto the surface of the LED (most available "white light" LEDs), this can result in >50% loss in efficiency. There is a need, then, to maximize the light output from an LED, particularly when phosphors are used, specifically when micro LEDs are used.

The use of using reflective materials around a mesa containing a LED in a light emitting laminate is reported. However these laminates typically apply LEDs via a pick and place or transfer printing technique. These manufacturing techniques lend themselves to more elaborate or complicated designs (such as mesas) but are not a cost effective from a large scale manufacturing perspective. There is a need for a laminate that is cost effective to make and that minimizes efficiency attributable to TIR, particularly when micro LEDs are employed.

WO 2011/082497 A1; EP 2 325 903 A1; US 2011/0204020 A1; U.S. Pat. No. 7,799,699

SUMMARY OF THE INVENTION

The present invention attempts to solve one or more of these problems. In a first aspect of the invention, a laminate capable of emitting light is provided. The laminate comprises a base layer, a phosphor layer, first and second conductive layers, a dielectric layer, a plurality of micro light emitting diodes (LEDs), and a reflective layer. The base layer has a first side of the laminate. The phosphor layer has a second side of the laminate. The first and second conductive layers are disposed between the base layer and the phosphor layers, and are capable of being energized. The first conductive layer is adjacent the base layer. One or more dielectric layers are disposed between the first conductive layer and the second conductive layer. Each of the plurality of LEDs has a diameter from 5 microns to 80 microns. Each of the plurality of LEDs has a first electrical contact that is communication with the first conductive layer, and has a second electrical contact with the second conductive layer. There are from 20 to 250 LEDs disposed per 1 $cm^2$ of a planar area of the laminate. The reflective layer disposed between the first conductive layer and the phosphor layer, alternatively between the dielectric layer(s) and the phosphor layer. In one embodiment of the invention, the laminate has a thickness of less than 1 mm.

A second aspect of the invention provides a method of making the aforementioned laminate comprising the step of printing LEDs on to the first conductive layer, wherein the printing is selected from screen printing, flexographic printing, or rotogravure printing.

A third aspect of the invention provides for a lighting apparatus comprising the aforementioned laminate and an electrical interface, wherein the laminate is capable of being in electrical communication with the electrical interface, and methods of making the same.

DETAILED DESCRIPTION OF THE INVENTION

Base Layer

Figure 1:
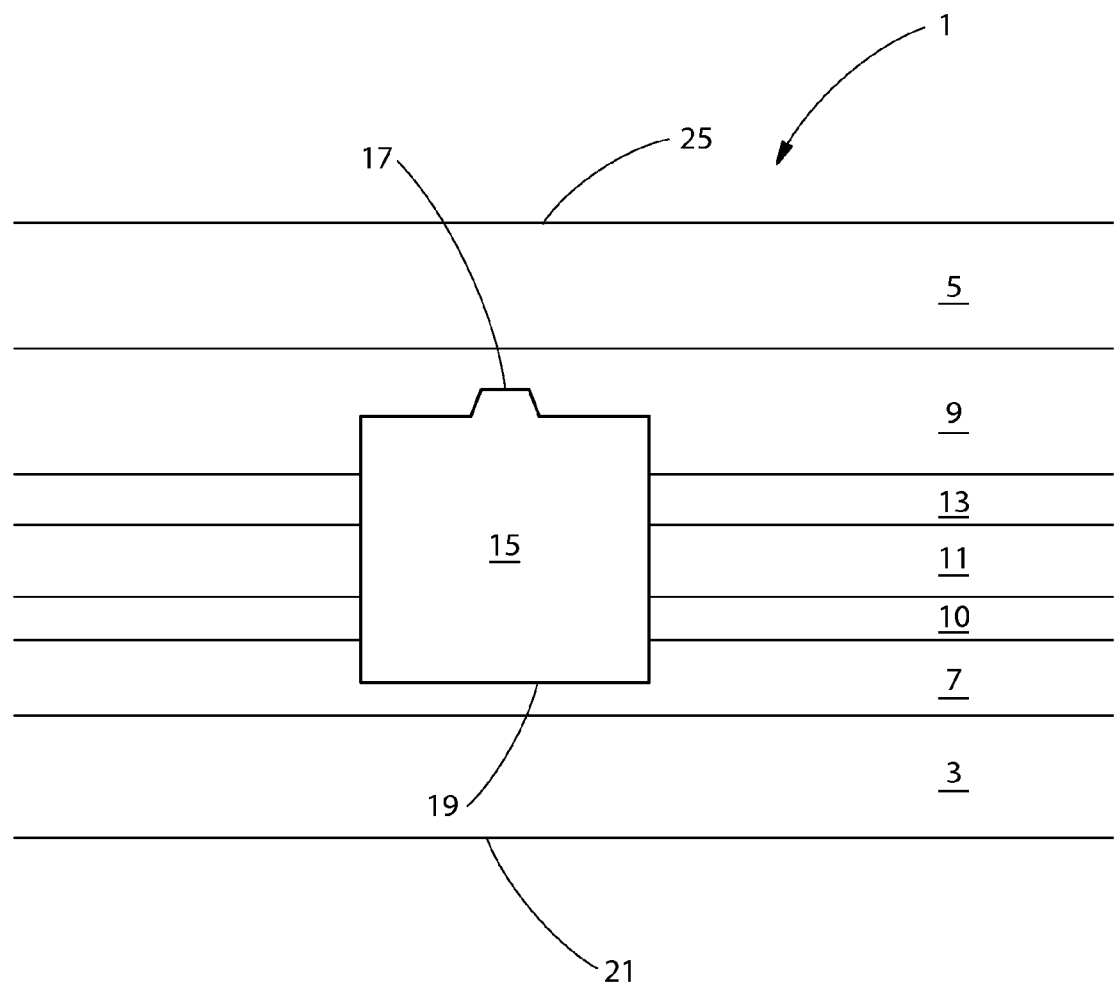
FIG. 1 is a cross sectional view of a laminate of the present invention.

The laminate of the present invention comprises a base layer. The base layer comprises a first side of the laminate. Optional additional layer(s) may be added to the first side of the laminate such as a protective layer (e.g., water proof seal, oxygen resistant layer, etc.). The base layer is typically continuous or substantially continuous, and provides a substrate to which a first conductive layer may be disposed upon. Non-limiting examples of materials that may form the base layer include: plastic, polymer material, rubber, fabric, glass, ceramic, silicon-derived materials, silica-derived material, concrete, stone, extruded polyolefinic film, polymeric nonwoven, cellulosic paper, and mixtures thereof. An exemplary base may be sufficient to provide electrical insulation. In one embodiment, the base comprises a plastic. Non-limiting examples of plastics include polyvinyl chloride, high and low density polyethylene, polypropylene, acrylic, polystyrene, polycarbonate, polyethylene napthalate, and copolymer, blends, or mixtures thereof. In one embodiment, the base layer comprises a polyester film made from stretched polehylene terphthalate (e.g., trade names Mylar, Melinex, and Hostaphan). For a description of possible base layer materials see e.g. US 2011/0204020 A1, ¶¶71-72. In one embodiment, the base layer is electrically insulating.

Phosphor Layer

The laminate of the present invention comprises a phosphor layer. The phosphor layer comprises a second side of the laminate. Optional additional layer(s) may be added to the second of the laminate such as a protective layer (e.g., water proof seal, oxygen resistant layer, etc.). The phosphor layer is typically continuous or substantially continuous, and converts light generated by LEDs to white light. Generally the phosphor layer is formed of any material capable of emitting light in the visible spectrum or to shift (e.g., stokes shift) the frequency of the emitted light (or other electromagnetic radiation at any selected frequency) in response to light (or other electromagnetic radiation) emitted from LEDs. For example, a yellow phosphor-based containing layer may be utilized with a blue light emitting diode to produce a substantially white light. Such luminescent compounds include various phosphors, which may be provided in any of various forms and with any of various dopants. The phosphor layer may be printed. Accordingly, the composition forming the phosphor layer(s) of the present invention may contain binders (such as phosphor binders available from DuPont or Conductive Compounds), both to aid the printing or other deposition process, and to provide adhesion of the phosphor to the underlying and subsequent overlying layers. In one embodiment, the phosphor layer may be provided in a uv-curable form or a heat-curable form. One supplier of a phosphor layer may include the Phosphor Tech Corp. of Lithia Springs, Ga., USA. In one embodiment, the phosphor layer comprises a planar area greater than 50% relative to the planar area of laminate. Alternatively the phosphor layer comprises a planar area from about 60% to about 100%, alternatively from about 70% to about 100%, alternatively from about 80% to about 100%, alternatively from about 90% to about 100%, alternatively from about 90% to about 99%, alternatively combinations thereof; relative to the planar area of the light emitting laminate described herein.

First and Second Conductive Layers

The laminate of the present invention comprises a first conductive layer and a second conductive layer. The first conductive layer and the second conductive layer are disposed between the base layer and the phosphor layer. The first conductive layer is adjacent the base layer. There may be a layer between the first conductive layer and the base layer but the first conductive layer is closer proximity to the base layer as compared to the second conductive layer. The first conductive layer and the second conductive layer comprise a material that is conductive such that these layers are capable of being energized (i.e., capable of carrying a current). Non-limiting examples of a material that is conductive may include silver, copper, indium tin Oxide (ITO), tin, aluminum, gold, platinum, noble metals, carbon, carbon black, carbon nanotube ("CNT"), single or double or multi-walled CNTs, graphene, graphene platelets, nanographene platelets, nanocarbon and nanocarbon and silver compositions, nano silver compositions, or combinations thereof. Suppliers may include Conductive Compounds (Londonberry, N.H., USA), DuPont, Dow Corning, Inc., Henkel/Emerson & Cumings, Henkel/Emerson & Cumings, AGFA Corp. (Ridgefield Park, N.J., USA).

In one embodiment, the first conductive layer and/or second conductive layer is/are transparent or substantially transparent. These layers may be printed. See e.g., U.S. Pat. No. 7,259,030 col. 14,1. 14 et seq. In one embodiment, the second conductive layer comprises at least 80% transmittance, preferably greater than 96%, alternatively greater than 97%, or 98%, or 99% transmittance. In another embodiment, the conductive layer comprises silver. In yet another embodiment, the second conductive layer comprises nanofibers of silver (available from NthDegree Technologies, Tempe, Ariz.). In yet another embodiment, the first and/or second conductive layer(s) are continuous or substantially continuous. A description of possible conductive layer materials are described for example in US 2011/0204020 A1, ¶73, ¶75, ¶77-82.

Dielectric Layer

The laminate of the present invention comprises at least a first dielectric layer disposed between the first conductive layer and a second conductive layer. In one embodiment, the laminate comprises a second dielectric layer adjacent to the first dielectric layer. The dielectric layer serves the function of an electrical insulator. In another embodiment, the dielectric layer comprises an adhesive material such an epoxy, or heat-meltable polymer. Without wishing to be bound by theory, a dielectric layer comprising an adhesive can be used to bind layers together. In one embodiment, the dielectric layer(s) are continuous or substantially continuous.

LED

The laminate of the present invention comprises a plurality of light emitting diodes (LEDs). The microLEDs have a diameter from about 5 microns to about 80 microns, alternatively from about 5 microns to about 70 microns, alternatively from about 10 microns to about 60 microns, alternatively from about 15 microns to about 50 microns, alternatively from about 20 microns to about 40 microns, alternatively from about 15 microns to about 35 microns, alternatively combinations thereof. In one embodiment, the LEDs have a thickness less than 85 microns, alternatively less than about 80 microns, alternatively from about 5 microns to about 80, alternatively from about 10 microns to about 70 microns, alternatively from about 15 microns to about 60 microns, alternatively combinations thereof. In yet another embodiment, the LED is less than 80 microns in any dimension, alternatively less than about 75 microns in any dimension, alternatively less than about 70 microns in any dimension.

The dimensions of the diodes may be measured using, for example, a scanning electron microscope (SEM), or Horiba's LA-920. The Horiba LA-920 instrument uses the principles of low-angle Fraunhofer Diffraction and Light Scattering to measure the particle size and distribution in a laminate of the present invention.

Each of the plurality of micro LEDs has a first electrical contact and a second electrical contact. The first electrical contact is in electrical communication with the first conductive layer, and the second electrical contact is in electrical communication with the second conductive layer. These electrical contacts may be anode or cathode contacts. When energized, the LED is part of a circuit, and when the laminate is energized, is capable of emitting light.

In one aspect of the invention, the laminate of the present invention comprises from about 5 to about 500 micro LEDs are disposed per 1 $cm^2$ of planar area of the laminate, alternatively from about 10 to about 200 micro LEDs are disposed, alternatively from about 15 to about 150 micro LEDs are disposed, alternatively from about 25 to about 125 micro LEDs are disposed, alternatively from about 35 to about 110 micro LEDs are disposed, alternatively from about 45 to about 100 micro LEDs are disposed, alternatively from about 60 to about 100, micro LEDs are disposed, alternatively from about 70 to about 90 microLEDs are disposed, alternatively about 80 to about 90 micro LEDs are disposed per 1 $cm^2$ of planar area of the laminate, alternatively combinations thereof.

In yet another aspect of the invention, the laminate of the present invention comprises a plurality of micro LEDs comprising a planar area from about 0.005% to about 0.5% relative to the planar area of the laminate, alternatively from about 0.01% to about 0.1%, alternatively from about 0.01% to about 0.3%, alternatively combinations thereof.

LEDs are well known. Suppliers of LED may include NthDegree Technologies; Cree; Osram; and Nichia, or any number of other LED suppliers. In an exemplary embodiment, each diode of the plurality of diodes comprises GaN and a silicon or sapphire substrate. In another exemplary embodiment, each diode of the plurality of diodes comprises a GaN heterostructure and GaN substrate. In various exemplary embodiments, the GaN portion of each diode of the plurality of diodes is substantially lobed, stellate, or toroidal.

In an exemplary embodiment, the plurality of diodes comprises at least one inorganic semiconductor selected from the group consisting of: silicon, gallium arsenide (GaAs), gallium nitride (GaN), GaP, InAlGaP, InAlGaP, AlInGaAs, InGaNAs, and AlInGASb. In another exemplary embodiment, the plurality of diodes comprises at least one organic semiconductor selected from the group consisting of: π-conjugated polymers, poly(acetylene)s, poly(pyrrole)s, poly(thiophene)s, polyanilines, polythiophenes, poly(p-phenylene sulfide), poly(para-phenylene vinylene)s (PPV) and PPV derivatives, poly(3-alkylthiophenes), polyindole, polypyrene, polycarbazole, polyazulene, polyazepine, poly(fluorene)s, polynaphthalene, polyaniline, polyaniline derivatives, polythiophene, polythiophene derivatives, polypyrrole, polypyrrole derivatives, polythianaphthene, polythianaphthane derivatives, polyparaphenylene, polyparaphenylene derivatives, polyacetylene, polyacetylene derivatives, polydiacethylene, polydiacetylene derivatives, polyparaphenylenevinylene, polyparaphenylenevinylene derivatives, polynaphthalene, polynaphthalene derivatives, polyisothianaphthene (PITN), polyheteroarylenvinylene (ParV) in which the heteroarylene group is thiophene, furan or pyrrol, polyphenylene-sulphide (PPS), polyperinaphthalene (PPN), polyphthalocyanine (PPhc), and their derivatives, copolymers thereof and mixtures thereof.

Examples of inorganic semiconductors may include, without limitation: silicon, germanium, and mixtures thereof; titanium dioxide, silicon dioxide, zinc oxide, indium-tin oxide, antimony-tin oxide, and mixtures thereof; II-VI semiconductors, which are compounds of at least one divalent metal (zinc, cadmium, mercury and lead) and at least one divalent non-metal (oxygen, sulfur, selenium, and tellurium) such as zinc oxide, cadmium selenide, cadmium sulfide, mercury selenide, and mixtures thereof; III-V semiconductors, which are compounds of at least one trivalent metal (aluminum, gallium, indium, and thallium) with at least one trivalent non-metal (nitrogen, phosphorous, arsenic, and antimony) such as gallium arsenide, indium phosphide, and mixtures thereof; and group IV semiconductors including hydrogen terminated silicon, carbon, germanium, and alpha-tin, and combinations thereof.

Diodes are also described in U.S. Pat. No. 7,799,699 B2.

Reflective Layer

A laminate of the present invention comprises a reflective layer. The reflective layer is disposed between the first conductive layer and the phosphor layer, alternatively between the first dielectric layer and the phosphor layer. In one embodiment, the reflective layer is disposed between the second dielectric layer and the phosphor layer. In another embodiment, the reflective layer is between the first dielectric layer and the second dielectric layer, wherein the second dielectric layer is transparent or substantially transparent. In yet another embodiment, the reflective layer is adjacent the second conductive layer but not between the second conductive layer and the phosphor layer.

The reflective layer may be continuous, substantially continuous, or non-continuous. The reflective layer is capable of providing specular reflection, diffuse reflection, or combination thereof. The reflective layer comprises a reflective material. Non-limiting examples of reflective material include aluminum, PbSc, and PbTe. Other examples may include silver, platinum, palladium, or combinations thereof. In one embodiment, the reflective layer comprises a thickness from about 25 nm to about 500 nm, alternatively from about 50 nm to about 250 nm, alternatively from about 100 nm to about 200 nm, alternatively combinations thereof. In another embodiment, the reflective layer is from about 500 nm to about 5 um, alternatively from about 1 um to about 4 um, alternatively from about 2 um to about 3 um, alternatively combinations thereof. Alternatively, the reflector could be constructed in layers and function as a distributed Bragg reflector (DBR).

In one embodiment of the invention, the reflective layer comprises a planar area greater than 50% relative to the planar area of laminate. Alternatively the phosphor layer comprises a planar area from about 60% to about 100%, alternatively from about 70% to about 100%, alternatively from about 80% to about 100%, alternatively from about 90% to about 100%, alternatively from about 90% to about 99%, alternatively combinations thereof; relative to the planar area of the light emitting laminate described herein.

Method of Making Laminate

Each of the layers of the laminate may be formed by deposition of the material that which comprises the layer. As used herein, "deposition" includes any and all printing, coating, rolling, spraying, layering, sputtering, plating, spin casting (or spin coating), vapor deposition, lamination, affixing and/or other deposition processes, whether impact or non-impact, known in the art. "Printing" includes any and all printing, coating, rolling, spraying, layering, spin coating, lamination and/or affixing processes, whether impact or non-impact, known in the art, and specifically includes, for example and without limitation, screen printing, inkjet printing, electro-optical printing, electroink printing, photoresist and other resist printing, thermal printing, laser jet printing, magnetic printing, pad printing, flexographic printing, hybrid offset lithography, Gravure, rotogravure and other intaglio printing, for example. All such processes are considered deposition processes herein and may be utilized. One supplier of capable of deposition or printing one or more layers of the present invention may include NthDegree Technologies Worldwide, Inc. of Tempe, Ariz., USA.

In on aspect of the invention, diodes are printed by screen printing or flexographic printing. This is in contrast to so called "pick and place" or transfer printing. Without wishing to be bound by theory, the transfer printing of diodes is expensive and does not allow for either the efficient or cost effective deposition of diodes described herein; or potentially achieving the density (per $cm^2$) of diodes contained in the laminate herein.

In one embodiment of the invention, the laminate of the present invention is thickness less than 1 mm, alternatively from about 0.1 mm to less than 1 mm, alternatively from about 0.1 mm to about 0.8 mm, alternatively from about 0.1 mm to about 0.5 mm, alternatively from about 0.15 mm to about 0.35 mm, alternatively less than about 0.5 mm, alternatively less than bout 0.4 mm, alternatively less than bout 0.3 mm, alternatively from about 0.20 mm to about 0.30 mm, alternatively combinations thereof.

Lighting Apparatus

In one aspect of the invention, the laminate of the present invention is made into a lighting apparatus. Accordingly the lightening apparatus comprises a laminate and an electrical interface, wherein the laminate is capable of being in electrical communication with the electrical interface. Thus, when the lighting apparatus is functionally engaged to a power source and energized, light is emitted from the laminate portion of the apparatus. Non-limiting examples of a lighting apparatus include a light bulb, a lighting fixture, or a lighting sheet. Non-limiting examples of an electrical interface include: ES, E27, SES, E14, L1, PL—2 pin, PL—4 pin, G9 halogen capsule, G4 halogen capsule, GU10, GU5.3, bayonet, and small bayonet. Palo Alto Research Center, Inc. of Palo Alto, Calif., USA may be able to make the laminate into a lighting apparatus.

EXAMPLE 1

Example 1 is directed to a non-limiting example of a cross section (not to scale) of a laminate capable of emitting light 1 according to the present invention. A base layer 3 of MYLAR is provided forming an outer first side 21 of the laminate 1. A phosphor layer 5 forms an outer second side 25 of the laminate 1. A first conductive layer 7, containing silver as the conductive material, is adjacent the base layer 3. A second conductive layer 9 is adjacent the phosphor layer 5. The second conductive layer 9 contains nano-fiber silver as the conductive material. The second conductive layer 9 is transparent having a transmittance greater than 95%. The first conductive layer 7 and the second conductive layer 9 are disposed between the base layer 3 and the phosphor layer 5, and the conductive layers 7, 9 are capable of being energized. A first dielectric layer 10 is adjacent the first conductive layer 7, and a second dielectric layer 11 is adjacent the second conductive layer 9. The dielectric layers 10, 11 are disposed between the first conductive layer 7 and the second conductive layer 9. A micro LED 15 (of a plurality of micro LED not shown) has a diameter of about 27 microns. The LED 15 has a first electrical contact 19 in electrical communication with the first conductive layer 7. The LED 15 has a second electric contact 17 in electrical communication with the second conductive layer 9. Although not shown, there are about 1,000 to about 5,000 micro LEDs disposed per 1 cm$^2$ of the laminate. The LEDs are screen printed or flexographic printed. A reflective layer 13 is disposed between the second dielectric layer 11 and the second conductive layer 9. The reflective layer contains aluminum (as the reflective material).

EXAMPLE 2

Figure 2:
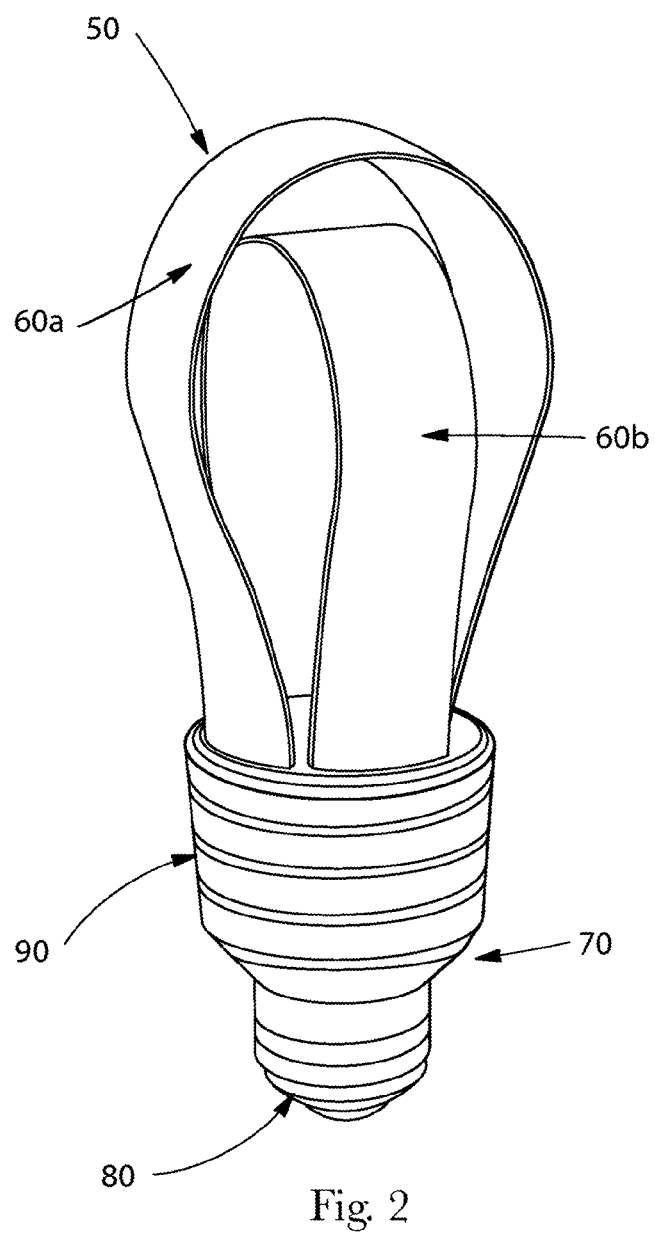
FIG. 2 is a perspective view of a lighting apparatus made from the laminate.

A non-limiting example of a lighting apparatus 50 is provided in FIG. 2. The apparatus 50 may comprise a laminate in the form of one or more flexible light strips 60a, 60b. The light strips are functionally attached to an electrical interface 70. The electrical interface has an Edison-style base 90 having an Edison-screw 80 for coupling to a power source.

The dimensions and values disclosed herein are not to be understood as being strictly limited to the exact numerical values recited. Instead, unless otherwise specified, each such dimension is intended to mean both the recited value and a functionally equivalent range surrounding that value. For example, a dimension disclosed as "40 mm" is intended to mean "about 40 mm."

Every document cited herein, including any cross referenced or related patent or application, is hereby incorporated herein by reference in its entirety unless expressly excluded or otherwise limited. The citation of any document is not an admission that it is prior art with respect to any invention disclosed or claimed herein or that it alone, or in any combination with any other reference or references, teaches, suggests or discloses any such invention. Further, to the extent that any meaning or definition of a term in this document conflicts with any meaning or definition of the same term in a document incorporated by reference, the meaning or definition assigned to that term in this document shall govern.

While particular embodiments of the present invention have been illustrated and described, it would be obvious to those skilled in the art that various other changes and modifications can be made without departing from the spirit and scope of the invention. It is therefore intended to cover in the appended claims all such changes and modifications that are within the scope of this invention.

What is claimed is:

1. A light emitting laminate comprising:
    a base layer comprising a first side of the laminate;
    a first conductive layer coupled to the base layer;
    a plurality of micro light emitting diodes (LEDs) coupled to the first conductive layer, each LED of the plurality of LEDs having a lateral dimension between 15 microns to 50 microns;
    at least one dielectric layer coupled to the first conductive layer and to the plurality of LEDs;
    a reflective layer coupled on a first side to the at least one dielectric layer;
    a second conductive layer adjacent or spaced apart from a second side of the reflective layer, the second conductive layer coupled to the plurality of LEDs; and
    a phosphor layer coupled over the second conductive layer and comprising a second side of the laminate;
    wherein from 25 to 200 micro LEDs of the plurality of LEDs are disposed per 1cm$^2$ of the laminate; and wherein the laminate has a thickness greater than 0.1 mm and less than 1 mm.

2. The laminate of claim 1, wherein the plurality of LEDs comprises a planar area from 0.005% to 0.5% relative to the planar area of the laminate.

3. The laminate of claim 1, wherein the plurality of LEDs each have a thickness greater than 5 microns and less than 35 microns.

4. The laminate of claim 1, further comprising a second dielectric layer disposed between the first dielectric layer and the reflective layer.

5. The laminate of claim 1, further comprising a second dielectric layer disposed between the reflective layer and the second conductive layer.

6. A method of making the laminate of claim 1, comprising the step of printing LEDs on to the first conductive layer, wherein the printing is selected from screen printing or flexographic printing.

7. The laminate of claim 1, further comprising:
    an electrical interface coupled to the first and second conductive layers.

8. The laminate of claim 7, wherein the electrical interface is coupleable to a standard Edison socket.

9. The laminate of claim 7, wherein the laminate has a form factor comprising at least one light strip forming a loop and coupled at each end to the electrical interface.

10. The laminate of claim 7, wherein the laminate has a form factor comprising at least two light strips forming first and second loops and each coupled at respective ends to the electrical interface.

11. The laminate of claim 10, wherein the second loop is smaller than the first loop and wherein the first and second loops are arranged perpendicular to each other in the lateral dimension.

12. The laminate of claim 1, further comprising:
    one or more protective layers coupled to the base layer, or to the phosphor layer, or to both the base layer and the phosphor layer.

13. A lighting apparatus comprising:
    an electrical interface; and
    a plurality of laminates coupled to the electrical interface, each laminate of the plurality of laminates comprising:
    a base layer comprising a first side of the laminate;
    a first conductive layer coupled to the base layer;
    a plurality of micro light emitting diodes (LEDs) coupled to the first conductive layer, each LED of the plurality of LEDs having a lateral dimension between 15 microns to 50 microns;
    at least one dielectric layer coupled to the first conductive layer and to the plurality of LEDs;
    a reflective layer coupled on a first side to the at least one dielectric layer;

a second conductive layer adjacent or spaced apart from a second side of the reflective layer, the second conductive layer having first and second sides, the first side of the second conductive layer coupled to the plurality of LEDs; and a phosphor layer coupled over the second side of the second conductive layer and further comprising a second side of the laminate;

wherein from 25 to 200 micro LEDs of the plurality of LEDs are disposed per 1 cm$^2$ of the laminate; and wherein the laminate has a thickness greater than 0.1 mm and less than 1 mm.

14. The laminate of claim 13, wherein the electrical interface is coupleable to a standard Edison socket.

15. The laminate of claim 13, wherein each laminate has a form factor comprising a light strip forming a loop and coupled at each end to the electrical interface.

16. The laminate of claim 15, wherein the second loop is smaller than the first loop and wherein the first and second loops are arranged perpendicular to each other in the lateral dimension.

17. The laminate of claim 13, wherein a first laminate of the plurality of laminates has a form factor comprising a first light strip forming a first loop and coupled at each end to the electrical interface, and a second laminate of the plurality of laminates has a form factor comprising a second light strip forming a second loop and coupled at each end to the electrical interface.

18. The laminate of claim 13, further comprising:
one or more protective layers coupled to the base layer, or to the phosphor layer, or to both the base layer and the phosphor layer.

* * * * *